(12) United States Patent
Hayashi et al.

(10) Patent No.: US 8,231,766 B2
(45) Date of Patent: Jul. 31, 2012

(54) METHOD FOR PRODUCING PRINTED WIRING BOARD

(75) Inventors: Noriki Hayashi, Osaka (JP); Yoshio Oka, Osaka (JP); Masahiko Kanda, Osaka (JP); Narito Yagi, Osaka (JP); Kenji Miyazaki, Osaka (JP); Kyouichirou Nakatsugi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 549 days.

(21) Appl. No.: 11/976,490

(22) Filed: Oct. 25, 2007

(65) Prior Publication Data

US 2008/0063792 A1 Mar. 13, 2008

Related U.S. Application Data

(62) Division of application No. 10/517,058, filed as application No. PCT/JP03/06906 on Jun. 2, 2003, now abandoned.

(30) Foreign Application Priority Data

Jun. 4, 2002 (JP) ................................ 2002-163526

(51) Int. Cl.
*C23C 14/00* (2006.01)
*B05D 5/12* (2006.01)

(52) U.S. Cl. ............. 204/192.15; 204/192.17; 427/98.4; 427/98.5; 427/98.8; 427/97.3; 427/301

(58) Field of Classification Search ................. 427/97.3, 427/98.4, 98.6, 98.8, 99.5, 301, 307; 204/192.15, 204/192.17
See application file for complete search history.

(56) References Cited

U.S. PATENT DOCUMENTS 3,391,455 A * 7/1968 Hirohata et al. ................. 29/852
(Continued)

FOREIGN PATENT DOCUMENTS

CN 1287771 A 3/2001
(Continued)

OTHER PUBLICATIONS

Japanese Office Action, with English translation, issued in Japanese Patent Application No. JP 2004-510294, mailed Jan. 15, 2009.
(Continued)

*Primary Examiner* — Brian K Talbot
(74) *Attorney, Agent, or Firm* — McDermott Will & Emery LLP

(57) ABSTRACT

A novel board for printed wiring comprising a fine conductor wiring having a clear and favorable boundary line and fabricated by an ordinal printing method such as screen printing, a printed wiring board using the same, and methods for manufacturing them. A board for printed wiring and a method for manufacturing the same are characterized in that the surface of a board is subjected to one of the surface treatments: (a) roughening, (2) plasma treatment, (3) roughening and then plasma treatment, and (4) roughening and then forming of a metal film coating by sputtering. A printed wiring board and a method for manufacturing the same is characterize in that a conductor wiring is fabricated by printing using a conductive paste containing metal particles the average particle diameter of which is 4 μm or less and the maximum particle diameter of which is 15 μm or less. Another printed wiring board and a method for manufacturing the same is characterized in that the surface of a conductor wiring fabricated using a conductive paste containing metal particles M and a binder B at a volume ratio of M/B of 1/1 to 1.9/1 is etched, a plating coating is formed on the surface.

1 Claim, 9 Drawing Sheets

U.S. PATENT DOCUMENTS

| | | | |
|---|---|---|---|
| 3,560,257 A | | 2/1971 | Schneble, Jr. et al. |
| 4,152,477 A | * | 5/1979 | Haruta et al. ............... 428/206 |
| 4,216,246 A | * | 8/1980 | Iwasaki et al. ............... 427/510 |
| 4,248,921 A | | 2/1981 | Steigerwald et al. |
| 4,487,811 A | | 12/1984 | Eichelberger et al. |
| 4,581,301 A | | 4/1986 | Michaelson |
| 4,705,592 A | | 11/1987 | Bahrle et al. |
| 5,019,944 A | | 5/1991 | Ishii et al. |
| 5,728,454 A | * | 3/1998 | Inaba et al. ............... 428/212 |
| 5,922,397 A | | 7/1999 | Brandt et al. |
| 6,228,465 B1 | * | 5/2001 | Takiguchi et al. ............ 428/209 |
| 6,261,647 B1 | * | 7/2001 | Komatsu et al. ............. 427/549 |
| 6,495,769 B1 | | 12/2002 | Saito et al. |
| RE40,947 E | * | 10/2009 | Asai et al. ................ 428/209 |
| 2002/0148733 A1 | | 10/2002 | Saito et al. |
| 2005/0271828 A1 | | 12/2005 | Saito et al. |

FOREIGN PATENT DOCUMENTS

| | | | |
|---|---|---|---|
| GB | 2 172 436 A | | 9/1986 |
| JP | 53-100468 A | | 9/1978 |
| JP | 60-258631 | | 12/1985 |
| JP | 61-270888 A | | 12/1986 |
| JP | 62-035594 | | 2/1987 |
| JP | 63-9995 A | | 1/1988 |
| JP | 63-075071 | | 5/1988 |
| JP | 01-007592 | | 1/1989 |
| JP | 04-267597 | * | 9/1992 |
| JP | 05-251511 | | 9/1993 |
| JP | 6-68924 | | 3/1994 |
| JP | 8-293213 A | | 11/1996 |
| JP | 09-051163 | | 2/1997 |
| JP | 9-83133 A | | 3/1997 |
| JP | 9-231834 A | | 9/1997 |
| JP | 09231834 | * | 9/1997 |
| JP | 11-198336 A | | 7/1999 |
| JP | 11-224978 | | 8/1999 |
| JP | 11-354911 A | | 12/1999 |
| JP | 2000-286559 | | 10/2000 |
| JP | 2001-160689 | | 6/2001 |
| JP | 2001-342450 | | 12/2001 |
| JP | 2002-280684 | | 9/2002 |
| WO | WO 00/21345 | | 4/2000 |

OTHER PUBLICATIONS

Chinese Office Action, with English Translation, issued in corresponding Chinese Patent Application No. 03813031.9, mailed Dec. 21, 2007.

Supplementary European Search Report issued in European Patent Application No. EP 03730747.7-1232/1542518 PCT/JP0306906, dated Jul. 24, 2009.

Japanese Notification of Reason for Refusal issued in Japanese Patent Application No. JP 2004-510294 dated Sep. 24, 2009.

Japanese Office Action issued in Japanese Patent Application No. JP 2004-510294 dated May 13, 2010.

* cited by examiner

METHOD FOR PRODUCING PRINTED WIRING BOARD

RELATED APPLICATIONS

This application is a Divisional of U.S application Ser. No. 10/517,058, filed Dec. 3, 2004 now abandoned, which is a U.S. National Phase under 35 U.S.C. §371 of International Application No. PCT/JP03/06906, filed Jun. 2, 2003, claiming priority of Japanese Application No. 2002-163526, filed Jun. 4, 2002, the entire contents of each of which are hereby incorporated by reference.

TECHNICAL FIELD

The present invention relates to a board for printed wiring that allows it to form a fine conductor wiring thereon by printing with of an electrically conductive paste, a printed wiring board that employs the same, and a method for manufacturing them.

BACKGROUND ART

It has been common to manufacture a flexible printed wiring board that comprises a board made of, for example, polyimide film with conductor wiring formed on one side or both sides thereof by the so-called subtractive method or semi-additive method In the subtractive method, it has been common to use a Cu-clad board (sputter-plated board, casting board, laminated board, etc.) comprising an insulating film such as polyimide film having Cu layer formed on one side or both sides thereof, with a circuit formed from the Cu layer by removing the unnecessary portion of the layer by selective etching, and forming an etching resist film used in etching by lithography in a pattern corresponding to the desired conductor wiring.

However, lithography requires it to coat the Cu layer with the resist, expose the resist to irradiation in a predetermined pattern and remove the unnecessary portions in a developing process so as to form the etching resist mask, while it is also necessary to remove the resist mask after the etching process.

Thus the subtractive method involves a large number of processes including the processes related to etching, resulting in low productivity of manufacturing the printed wiring board. In addition, use of the expensive Cu-clad board and the resist results in a significant increase in the manufacturing cost.

In the semi-additive method, a board having an electrically conductive layer formed over the entire surface thereof by sputtering or the like is provided with conductor wiring by forming thin metal films selectively on predetermined portions by plating or the like. A plating resist film that covers the portions where the conductor wiring should not be formed is also formed generally by lithography.

As a result, although the semi-additive method is less expensive than the subtractive method due to the use of a simple film as the board, it still involves a large number of processes including the plating processes, thus resulting in low productivity of manufacturing the printed wiring board. In addition, use of the expensive resist still leads to high manufacturing cost.

Moreover, in case the conductor wiring formed by the semi-additive method includes narrow lines and wide lines, wider lines tend to become thicknesser and it becomes difficult to form the whole conductor wiring with uniform thickness.

In order to solve these problems and manufacture a printed wiring board with lower cost, such a manufacturing method has been in practice as an electrically conductive paste that contains fine metal particles and a binder made of resin or the like is directly applied to the board surface by screen printing or other printing method so as to form conductor wiring (for example, refer to Japanese Laid-Opened Patent Publication H06-68924-A (1994)).

However, while it is attempted to form the conductor wiring from fine lines measuring 100 μm both in the width and the space between the lines by the printing method using an electrically conductive paste in order to meet the demands for finer conductor wiring, the line width of the conductor wiring actually formed tends to be larger than the intended width.

As a result, such problems occur as adjacent lines become too close to or contact each other, or the lines have blurred edges, thus making it unable to form satisfactory conductor wiring.

There is also such a problem that, in an interface for connection with an external circuit provided in the conductor wiring for use as terminals to connect with component leads or connectors, or as contacts of film switches intended for a flexible printed wiring board, electrical resistance of the conductor wiring becomes higher and mechanical strength becomes lower as the lines width and space are made smaller.

In order to achieve lower resistance and increase the mechanical strength in the connecting portion, it has been proposed to form a metal plating film on the surface of conductor wiring that has been formed by printing (for example, refer to Japanese Laid-Opened Patent Publication S60-258631-A (1985)).

Recently the use of anisotropically conductive film and anisotropically conductive paste has been increasing for the connection of electrical and electronic components because these materials enable simple connection work with fine pitches. Such connection methods make it necessary to process the surface of the conductor wiring formed by printing method so as to make the joint suitable for the connection method, for example by applying gold plating.

Further, in order to improve the electrical conductivity of the entire conductor wiring formed with the electrically conductive paste, the entire surface thereof is coated with a plating layer (for example, refer to Japanese Laid-Opened Patent Publication H11-224978 (1999)).

However, it is difficult to satisfactorily form a continuous film by plating directly on the conductor wiring that is formed from the electrically conductive paste either on the portion thereof used for connection with an external circuit or over the entire surface thereof, without any treatment applied to the surface in advance.

Even when a plating layer is formed, it may not be bonded with the conductor wiring with sufficient strength.

When a flexible printed wiring board that comprises a board made of a flexible film and is subjected to bending during use experiences such problems as described above, peel off of layer and/or line breakage can occur when the printed wiring board is bent.

These problems become more serious when the line width of the printed wiring board is made smaller. This is because line width becomes smaller and the area of contact with the board or the plating layer becomes smaller, resulting in lower bonding strength, as the line width of the printed wiring board is made smaller.

DISCLOSURE OF THE INVENTION

An object of the present invention is to provide a novel board for printed wiring that makes it possible to manufacture a printed wiring board with higher productivity and lower cost than in the case of forming the conductor wiring by lithography or the like by forming the satisfactory conductor wiring comprising fine lines with clear edges, that has been difficult to form by a printing method, by a conventional printing method such as screen printing, and a method of manufacturing the same.

Another object of the present invention is to provide a printed wiring board that allows for higher productivity and lower cost due to the formation of a satisfactory conductor wiring comprising fine lines with clear edges on the surface of the board for printed wiring by a printing method, and a method of manufacturing the same.

Further another object of the present invention is to provide a printed wiring board that is free from such troubles as peel-off and line breakage when used as a flexible printed wiring board that is bent since the conductor wiring formed by a printing method is bonded more firmly not only with the board that serves as the base but also with the plating layer formed on the portion of the conductor wiring used for connection, and a method of manufacturing the same.

The board for printed wiring of the present invention is made by treating the surface of a board whereon a conductor wiring is to be formed by one of the following treatment methods:
(1) surface roughening treatment;
(2) plasma treatment;
(3) surface roughening treatment followed by plasma treatment; and
(4) surface roughening treatment followed by metal coating process by sputtering.

The method of manufacturing a board for printed wiring of the present invention comprises the steps of: preparing a board; and treating the surface of the board whereon the conductor wiring is to be formed by one of the following treatment methods:
(1) surface roughening treatment;
(2) plasma treatment;
(3) surface roughening treatment followed by plasma treatment; and
(4) surface roughening treatment followed by metal coating process by sputtering.

With the conventional printing method such as screen printing, it is a common practice to set the thickness of an emulsion layer of a screen and other printing conditions to achieve satisfactory printing, in consideration of such factors as the volume loss of the paste through drying and removal of a solvent.

However, the surface of the board made of a resin that is high in heat resistance, weatherability, chemical resistance and mechanical strength, such as polyimide, polyethylene naphthalate, polyamideimide, polyethylene terephthalate, whole-alomatic polyamide, liquid crystal polyester or fluororesin which is preferably used to make print circuit boards is slippery, and the electrically conductive paste applied on the surface is fluid.

As a result, even when the thickness of the emulsion layer of the screen and other printing conditions are properly set, the various problems described above occur because the electrically conductive paste applied by printing spreads out of the printed pattern by gravity itself or other causes, before drying and solidifying.

Specifically, the electrically conductive paste applied by printing in a pattern of fine lines to form a conductor wiring consisting of fine lines 100 μm in width at a space of 100 μm from each other (hereinafter referred to as 200 μm pitch) or even smaller width and spacing, spreads out of the printed pattern before drying and solidifying, and the conductor wiring is formed with the lines dried and solidified in the spread condition.

As a result, the line width of the conductor wiring that is actually formed tends to be larger than the intended width, with adjacent lines often becoming too close to or contact each other.

In case much of the electrically conductive paste spreads out of the printed pattern and solidifies, the resultant conductor wiring has an insufficient thickness and a lower concentration of metal particles, resulting in particularly blurred edges.

Thus the conductor wiring of fine and clear-edged lines cannot be formed.

These problems become more conspicuous when metal particles of smaller particle diameter are used as the electrically conductive filler contained in the electrically conductive paste in order to meet the requirement for smaller line width of the conductor wiring.

Large metal particles are less likely to flow along with the solvent or the resin contained in the electrically conductive paste before drying after printing, thus making the problems described above less likely to occur. However, large metal particles tend to block the screen used in screen printing, and make it impossible to use a screen of fine mesh to meet the requirement for smaller line width of the conductor wiring. Thus it is desirable to use metal particles of smaller particle diameter to meet the requirement for smaller line width of the conductor wiring, but small metal particles are likely to flow with the solvent or the resin contained in the electrically conductive paste and cause the problems described above.

On the other hand, when the board is subjected to surface treatment by one of the methods (1) to (4) described above, the board surface is given the effect to suppress the electrically conductive paste from spreading. Therefore, even when electrically conductive paste that contains metal particles of small particle diameter that have high fluidity is used, the electrically conductive paste can be prevented from spreading out of the printed pattern before drying and solidifying.

Accordingly, when the board for printed wiring of the present invention is used, therefore, a satisfactory conductor wiring that comprises fine lines with clear edges, that has been difficult to form by a printing method in the prior art, can be formed by a conventional printing method such as screen printing. This makes it possible to manufacture a printed wiring board having such a satisfactory conductor wiring with higher productivity and lower cost than the prior art methods that employ, for example, lithography.

Among the surface roughening treatment methods described above, the methods (1), (3) and (4) may not achieve a sufficient effect of suppressing the spreading of the electrically conductive paste, since surface roughening of the board less than 30 nm in terms of center line average roughness Ra is not sufficient.

When the center line average roughness Ra exceeds 300 nm, on the other hand, the board surface becomes too rough for the electrically conductive paste to deposit thereon and may have an adverse effect in suppressing the spreading of the electrically conductive paste.

Accordingly, in case one of the methods (1), (3) and (4) is employed, the surface roughening treatment is preferably carried out so as to roughen the board surface in a range from 30 to 300 nm in terms of center line average roughness Ra.

The metal layer formed to cover the roughened surface of the board by sputtering in the surface treatment (4) is preferably a porous metal layer made of at least one kind of metal selected from among the group consisting of Al, Cr, Co, Ni, Cu and Ag.

The metal layer formed from such a metal by sputtering has porous structure constituted from fine metal particles of cylindrical shape, and has an effect of suppressing the electrically conductive paste from spreading.

Such a metal layer also absorbs a solvent contained in the electrically conductive paste into the gaps between the fine cylindrical particles, so that the electrically conductive paste dries and solidifies in a very short period of time after printing.

Thus the metal layer described above is very effective, along with the surface roughening treatment applied to the board below thereof, in efficiently drying and solidifying the electrically conductive paste while preventing it from spreading.

While it is necessary to remove the metal layer from the portion other than that where the conductor wiring is formed by selective etching after forming the conductor wiring by printing, in order to prevent short-circuiting between the conductors or other troubles, the porous metal layer made of such a metal as described above also has an advantage that it is easy remove by selective etching.

In order to prevent the cylindrical particles from being packed densely and to form a coarse porous metal layer that is very effective in suppressing the spread of the electrically conductive paste and in absorbing the solvent, it is preferable to form the metal layer while directing the sputtered metal particles in an oblique direction toward the board surface in the sputtering process.

In order improve the heat resistance, weatherability, chemical resistance, mechanical strength and other properties of the board, at least the surface of the board where the conductor wiring is to be formed, namely the surface where the surface treatment of (1) to (4) is applied is preferably formed from at least one kind of resin selected from the group consisting of polyimide, polyethylene naphthalate, polyamideimide, polyethylene terephthalate, whole-aromatic polyamide, liquid crystal polyester and fluororesin.

The printed wiring board of the present invention is made by forming a conductor wiring by printing an electrically conductive paste that contains (a) metal particles having an average particle diameter of 4 μm or smaller and maximum particle diameter of 15 μm or smaller as an electrically conductive filler and (b) a binder on the surface of the board for printed wiring mentioned above, whereon the surface treatment of (1) to (4) has been applied.

The method of manufacturing a printed wiring board according to the present invention comprises the steps of: preparing an electrically conductive paste that contains (a) metal particles having an average particle diameter of 4 μm or smaller and maximum particle diameter of 15 μm or smaller as an electrically conductive filler and (b) a binder; and forming a conductor wiring by a printing method using the electrically conductive paste on the surface of the board for printed wiring mentioned above, whereon the surface treatments (1) to (4) has been applied.

The maximum particle diameter of the metal particles in the present invention refers to the maximum value in a region of particle diameter distribution defined by 3σ, namely three times the standard deviation σ.

When the conductor wiring is to be formed with 200 μm pitch or smaller line width and spacing, a screen of mesh size as small as possible should be used.

However, the conventional electrically conductive paste widely used in the prior art contain flat-shaped metal particles (flakes, scale-shaped or foil chips) that often exceed 20 μm in maximum particle diameter, for the purpose of decreasing the contact resistance between the metal particles and improve the electrical conductivity.

As a consequence, in case the conventional electrically conductive paste that contains large metal particles as described above is used when forming the conductor wiring by screen printing using a screen of fine mesh, continuous printing operation for mass production of the printed wiring board tends to result in blocking of the screen.

When the electrically conductive paste that contains metal particles having an average particle diameter of 4 μm or smaller and maximum particle diameter of 15 μm or smaller is used, in contrast, the conductor wiring can be formed without having the screen of fine mesh blocked, by employing the screen printing that is higher in productivity and lower in cost than the conventional method using, for example, lithography.

Moreover, since the surface of the board for printed wiring where the conductor wiring is to be formed has been processed by one of the surface treatments (1) to (4), the undesirable fluidity of the metal particles described above and various problems accompanying therewith can be surely prevented from occurring, even when the conductor wiring is printed by using the electrically conductive paste that contains the fine metal particles.

According to the present invention, therefore, satisfactory conductor wiring with fine and clear lines is formed by printing on the surface of the board for printed wiring, and the printed wiring board is obtained with high productivity and low cost.

In order to form a conductor wiring consisting of fine lines 50 μm in width at a space of 50 μm from each other (hereinafter referred to as 100 μm pitch) or even smaller width and spacing by screen printing, it is necessary to use a screen of fine mesh in a range from 400 to 500 mesh.

In order to cause the metal particles used as the electrically conductive filler to pass smoothly through the screen of such a fine mesh, it is preferable to control the maximum particle diameter within $\frac{1}{5}$, particularly within $\frac{1}{10}$ of the mesh size. In other words, the maximum particle diameter is preferably 5 μm or smaller with average particle diameter being 1 μm or smaller.

Moreover, in order to cause the metal particles to pass through the screen more smoothly and be distributed uniformly behind the screen meshes, it is preferable to use metal particles of spherical or granular shape that are better in fluidity.

Metal particles of spherical or granular shape having an average particle diameter of 1 μm or smaller have another advantage of being easier to manufacture than those having similar average particle diameter with flat shape, and being available relatively easily at a low cost.

Thus, it is preferable to use the metal particles of spherical or granular shape having an average particle diameter of 1 μm or smaller and maximum particle diameter of 5 μm or smaller as the electrically conductive filler.

Another printed wiring board of the present invention is made by forming a conductor wiring by printing an electrically conductive paste containing metal particles M used as an electrically conductive filler and a binder B in volume ratio of M/B=1/1 to 1.9/1 on the surface of the board for printed wiring mentioned above, whereon the surface treatment of (1) to (4) has been applied, etching the surface of the conductor wiring on at least a portion thereof used for connection with an external circuit so as to expose the metal particles on the surface, and forming a plating layer on the surface of the conductor wiring where the metal particles have been exposed by etching.

The method of manufacturing a printed wiring board according to the present invention comprises the steps of: preparing an electrically conductive paste that contains metal particles M used as an electrically conductive filler and a binder B in volume ratio of M/B=1/1 to 1.9/1; forming a conductor wiring by a printing method using the electrically conductive paste on the surface of the board for printed wiring mentioned above, whereon the surface treatment of (1) to (4) has been applied; etching the surface of the conductor wiring on at least a portion thereof used for connection with an external circuit so as to expose the metal particles on the surface; and forming a plating layer on the surface of the conductor wiring where the metal particles have been exposed by etching.

It is difficult to form a continuous film by plating directly on the conductor wiring formed using the electrically conductive paste either on the portion thereof used for connection with an external circuit or over the entire surface thereof, without any treatment applied to the surface as mentioned previously.

This is because, while the plating layer grows around metal particles, that are exposed on the surface of the conductor wiring, as the cores of deposition in electroless plating or the like, the conductor wiring that is not surface-treated has significantly smaller number of metal particles that can serve as the cores, since majority of the metal particles located near the surface are covered by a thin film of the binder.

As described previously, even when a plating layer can be formed on the conductor wiring, the plating layer may have insufficient strength of bonding with the conductor wiring that serves as the base layer.

This is because it is important for the plating layer, whether it is formed by electroless plating or electroplating, to have direct contact with the metal particles contained in the conductor wiring in order to have sufficient bonding strength, although much of the metal particles are covered by the thin film of the binder in the untreated conductor wiring and the plating layer cannot make direct contact with the metal particles.

Therefore, it is preferable to expose the metal particles in the surface of the conductor wiring by etching the surface of the conductor wiring that has been formed, before plating.

In case the conductor wiring is formed from the electrically conductive paste on the surface of the board that has not been subjected to the surface treatment (1) to (4), not only the conductor wiring with fine and clear lines cannot be formed because of the slippery and blurry surface but also peel-off is likely to occur because the strength of bonding with the conductor wiring that has been formed is weak.

Furthermore, if the electrically conductive paste contains less metal particles than volume ratio of M/B=1/1, there occurs the shortage of the metal particles that serve as the core for formation of plating layer and provide the strength of bonding with the plating layer. As a consequence, continuous plating layer of satisfactory quality cannot be formed even when it is formed on the metal particles that are exposed by etching the surface of the conductor wiring. Even when the plated layer can be formed, the plating layer may have insufficient strength of bonding with the conductor wiring that serves as the base layer.

When the electrically conductive paste contains more metal particles than volume ratio of M/B=1.9/1, there occurs relative shortage of the binder.

The binder provides the strength of bonding of the conductor wiring formed from the electrically conductive paste onto the board made of resin film or the like.

Therefore, shortage of the binder leads to such a problem that, if ever the conductor wiring has been formed on the surface of the board for printed wring that has been processed by one of the surface treatments (1) to (4), the conductor wiring does not have sufficient strength of bonding with the board for printed wiring that serves as the base layer.

The binder also provides the strength of the conductor wiring itself that is formed from the electrically conductive paste.

As such, shortage of the binder leads to such a problem that, if the conductor wiring is formed on the board for printed wiring with some level of bonding strength, strength of the conductor wiring itself decreases significantly and peel-off becomes likely to occur in the layer when subject to an external force.

Thus in any of these cases, peel-off or line breakage tends to occur when the flexible printed wiring board is bent during use.

In contrast, the conductor wiring can be bonded firmly with both the board and the plating layer and the conductor wiring itself has sufficient strength, when the conductor wiring is formed by a printing method using the electrically conductive paste that contains metal particles M used as the electrically conductive filler and the binder B in volume ratio of M/B in a range from 1/1 to 1.9/1 on the surface of the board for printed wiring that has been processed by one of the surface treatments (1) to (4), and then the metal particles are exposed on the surface by etching the conductor wiring, and a plating layer is formed thereon.

Therefore, according to the present invention, the printed wiring board that is free from peel-off or line breakage when bent during use can be made.

The plating layer may be formed either by electroplating or electroless plating.

Among these, electroplating is capable of forming a plating layer at a relatively high speed by controlling the current supply.

In the case of electroplating, however, since it is necessary to supply power by using the conductor wiring as the cathode in order to form the plating layer selectively on the conductor wiring, a power supply line must also be formed on the board. As a result, in addition to the restriction imposed on the pattern of the conductor wiring, there is a necessity for the step of removing the power supply line after forming the plating layer, in order to prevent short-circuiting between wirings.

In the case of electroless plating, in contrast, the plating layer can be formed selectively on an area where the metal particles are exposed simply by etching the conductor wiring at least in the portion used for connection with an external circuit, and therefore the problem related to the electroplating described above does not occur. In addition, thickness of the plating layer required for connection is several micrometers, which can be formed at a sufficiently high speed even with electroless plating.

Therefore, it is preferable to form the plating layer by electroless plating.

BEST MODE FOR CARRYING OUT THE INVENTION

Figure 1:
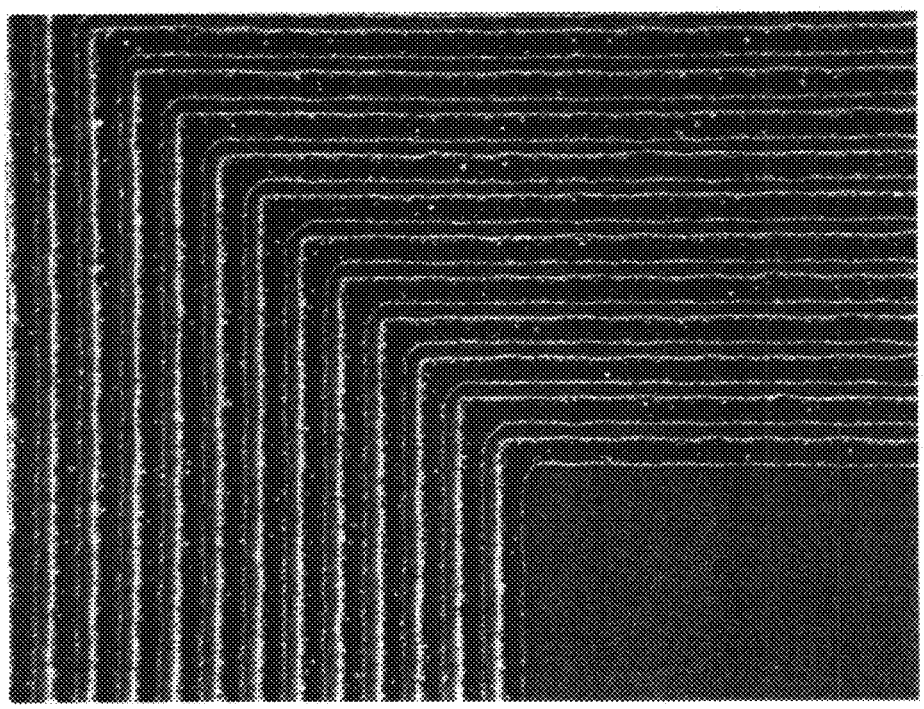
FIG. 1 is a photograph taken with a stereoscopic microscope of a fine wiring portion of a conductor wiring printed by using an electrically conductive paste on the surface of a board for printed wiring fabricated in Example 1 after surface roughening treatment.

Now the present invention will be described in detail below.
<Board for Printed Wiring and Method of Manufacturing the Same>
[Board]

Any boards made of various materials in various shapes and structures widely known to the board for printed wiring may be used as the board of the present invention.

In order improve the heat resistance, weatherability, chemical resistance, mechanical strength and other property of the board, however, the surface of the board where the conductor wiring is to be formed is preferably formed from at least one kind of resin selected from the group consisting of polyimide (whole-aromatic polyimide, polyetherimide, polymaleimideamine, etc.), polyethylene naphthalate, polyamideimide, polyethylene terephthalate, whole-aromatic polyamide, liquid crystal polyester and fluororesin.

Specifically, the board may be a single-layer film or sheet made of one of the resins described above, a laminate consisting of such a film or sheet and a reinforcing fiber layer, a composite sheet made by dispersing reinforcing fibers in the resin described above, or a composite sheet coated with the resin described above, among others. A single-layer film or sheet made of one of the resins described above is particularly preferable for the flexible printed wiring board.

[Surface Treatment]

The board for printed wiring of the present invention is made by treating the surface (either on one side or on both sides) of the board whereon the conductor wiring is to be formed by one of the following treatment methods:
(1) Surface roughening treatment;
(2) Plasma treatment;
(3) Surface roughening treatment followed by plasma treatment; or
(4) Surface roughening treatment followed by metal coating process by sputtering.

The method of manufacturing the board for printed wiring of the present invention comprises the steps of: preparing a board; and treating the surface of the board whereon the conductor wiring is to be formed by one of the treatment methods (1) to (4) described above.
(Surface Roughening Treatment)

As the method of surface roughening treatment for the board included in the treatment of (1), (3) or (4), wet or dry blasting, wet etching, dry etching or the like may be used.

The surface roughening treatment is preferably carried out by these methods so that center line average roughness Ra of the board surface becomes in a range from 30 to 300 nm, as described previously.

In order to form a satisfactory conductor wiring while improving the effect of surface roughening to suppress spreading of the electrically conductive paste and preventing excessive roughening that would result in blurring, it is preferable to control the center line average roughness Ra of the board surface within a range from 50 to 100 nm in case the surface roughening treatment of (1) is applied individually.

When the method (3) that combines surface roughening treatment and plasma treatment is employed, upper limit of the range of surface roughness that achieves an effect similar to that of (1) can be shifted upward by the mutually enhancing effects of both treatments. Specifically, an effect similar to that of (1) can be achieved if the surface of the board is treated so that center line average roughness Ra falls in a range from 50 to 200 nm.

When the method (4) that combines surface roughening treatment and formation of metal layer is employed, the range of surface roughness that achieves an effect similar to that of (1) can be expanded on both sides of the upper and lower limits by the mutually enhancing effects of both treatments. Specifically, an effect similar to that of (1) can be achieved if the surface of the board is treated so that center line average roughness Ra falls in a range from 40 to 200 nm.
(Plasma Treatment)

$N_2$ or Ar gas may be used as the gas in the plasma treatment of the board surface in the method (2) or (3).

The plasma treatment is carried out in an atmosphere of the above-mentioned gas under reduced pressure, exposing the surface of a board, that has not been treated or has undergone surface roughening treatment, for a predetermined period of time to a low-temperature plasma generated by applying a DC voltage across a pair of electrodes of parallel plates type, or by applying a high frequency voltage to a high frequency electrode or a high frequency antenna.

While there is no limitation to the extent of the plasma treatment, it is preferable to expose the object, within a period of about one minute, to a plasma of power density ($W/cm^2$) in a range from 0.05 to 1 $W/cm^2$, that is the input power (W) divided by the electrode area ($cm^2$). Longer duration of treatment is not capable of achieving significant improvement in the effect, and one minute or less of treatment is sufficient in consideration of the efficiency of work.

(Coating by Sputtering)

The metal layer formed by sputtering in the method (4) on the board surface that has been subjected to surface roughening treatment is preferably a porous metal layer constituted from fine cylindrical particles as mentioned previously.

Such a porous metal layer may be made of at least one kind of metal selected from among the group consisting of Al, Ti, Cr, Fe, Co, Ni, Cu, Mo and Ag.

In consideration of the ease of removing the unnecessary portion of the conductor wiring by selective etching after forming the conductor wiring by printing, the porous metal layer is preferably made of at least one kind of metal selected from among the group consisting of Al, Cr, Co, Ni, Cu and Ag.

When removal by selective etching is not easy, the metal layer may remain in an unnecessary portion, or the necessary metal layer may be removed from under the conductor wiring resulting in the loss of the conductor wiring. When the removal by selective etching can be done easily, unnecessary portion of the metal layer can be selectively removed efficiently without such troubles as described above.

In order to prevent the cylindrical particles from being packed densely in the metal layer and form a coarse porous metal layer, it is preferable to form the metal layer by directing the sputtered metal particles in an oblique direction toward the board surface in the sputtering process.

Opposing cathode sputtering method can be preferably employed to form the metal layer by directing the sputtered metal particles in an oblique direction toward the board surface in the sputtering process.

In the opposing cathode sputtering method, two targets made of the metal to be sputtered are placed to oppose in parallel to each other, and the board is disposed at a position where the sputtered metal particles can reach, outside the space between the two targets, with the surface of the board facing upward.

Then in an atmosphere of Ar gas or the like under reduced pressure, a DC voltage is applied across the two targets used as the cathode and the board as the anode, so as to generate low-temperature plasma in the space between the two targets. The plasma causes the targets to release sputtered metal particles while directing the sputtered metal particles in an oblique direction toward the board surface so as to form the metal layer.

With the apparatus described above, low-temperature plasma may also be generated by applying high frequency voltage to the two targets in a similar atmosphere with the board being grounded, so as to cause the targets to release sputtered metal particles while directing the sputtered metal particles in an oblique direction toward the board surface so as to form the metal layer.

A modified method using parallel plate sputtering method may also be employed as another sputtering method to form the metal layer while directing the sputtered metal particles in an oblique direction toward the board surface in the sputtering process.

While the targets and the board held on an opposing electrode are disposed in parallel to each other in the ordinary parallel plate sputtering method, in the modified method, direction of the opposing electrode is controlled so as to hold the board with the surface thereof inclined at an angle to the target surface, thereby directing the sputtered metal particles in an oblique direction toward the board surface. In another modified method, the board may be disposed in parallel to the target surface but at such an offset position as the particles sputtered from the target hit the board surface at a predetermined angle.

While there is no restriction on the angle of the trajectory of the sputtered particles to the board surface, it is preferably in a range from 45 to 60°.

When the incident angle is less than the range described above, the metal layer may not be formed efficiently. When the incident angle is larger than the range described above, it may lead to lower effect of directing the sputtered particles obliquely toward the board in suppressing the cylindrical metal particles from being packed densely so as to roughen the surface of the porous metal layer.

While there is no limitation on the thickness of the metal layer, it is preferably in a range from 50 to 500 Å.

Thickness of the metal layer less than the range described above may result in insufficient effect of forming the metal layer in suppressing the electrically conductive paste from spreading and absorbing the solvent contained in the electrically conductive paste.

When the thickness is larger than the range described above, even when the electrically conductive paste are directed obliquely toward the board so as to form the metal layer, the metal layer becomes too dense and sufficient effect of suppressing the electrically conductive paste from spreading and absorbing the solvent contained in the electrically conductive paste may not be obtained. Also because a thicknesser metal layer requires longer time to remove the unnecessary portion by etching, the board and/or the conductor wiring may be damaged.

It is a common practice to treat the board surface by generating low-temperature plasma in the same sputtering apparatus through the so-called ion bombardment prior to forming the coat by sputtering in the method (4). Therefore, the method (4) includes a case of applying the surface roughening treatment, plasma treatment and then forming the coat.

<Printed Wiring Board I and Method of Manufacturing the Same>

A first printed wiring board of the present invention is made by forming the conductor wiring by a printing method using the electrically conductive paste that contains (a) metal particles having an average particle diameter of 4 μm or smaller and maximum particle diameter of 15 μm or smaller as an electrically conductive filler and (b) a binder, on the surface (either on one side or both sides) of the board for printed wiring where one of the surface treatments (1) to (4) has been applied.

The method of manufacturing a printed wiring board according to the present invention comprises the steps of: preparing the electrically conductive paste that contains the components of (a) and (b); and forming the conductor wiring on the surface of the board for printed wiring where one of the surface treatments (1) to (4) has been applied, by a printing method using the electrically conductive paste described above.

[Electrically Conductive Paste]

(Metal Particles)

The reason why the metal particles are restricted to average particle diameter of 4 μm or smaller and maximum particle diameter of 15 μm or smaller is as described previously.

The metal particles may have various shapes including flat shape (flakes, scale-shaped or foil chips), spherical or granular, as long as the average particle diameter and the maximum particle diameter are within the ranges described above.

The metal particles are preferably spherical or granular metal particles having an average particle diameter of 1 μm or smaller and maximum particle diameter of 5 μm or smaller, among those described above, also for the reason described previously.

However, excessively fine metal particles are difficult to manufacture even in spherical or granular shape, and not only leads to increased manufacturing cost of the printed wiring board but also may decrease the electrical conductivity of the conductor wiring due to oxidation as smaller particles have higher reactivity. Thus metal particles preferably have average particle diameter of 0.1 μm or larger and maximum particle diameter of 0.5 μm or larger.

The metal particles are preferably made of at least one kind of metal selected from among the group consisting of Al, Ni, Cu, Ag and Au, in consideration of the electrical conductivity of the conductor wiring.

While fluidity increases as the metal particles become smaller, electrical conductivity of the conductor wiring tends to decrease, thus resulting in higher resistance.

In order to increase the electrical conductivity of the conductor wiring, a small amount of flat-shaped metal particles that are effective in reducing the contact resistance between metal particles and increasing the electrical conductivity may be mixed in the spherical or granular metal particles. The spherical or granular metal particles preferably have average particle diameter of 1 μm or smaller and maximum particle diameter of 5 μm or smaller, and the flat-shaped metal particles to be mixed preferably have average particle diameter of 4 μm or smaller and maximum particle diameter of 15 μm or smaller, also for the reason described previously.

(Binder)

Various compounds that are known to be applicable as a binder for electrically conductive paste may be used as the binder. Specifically, the binder may be made of thermoplastic resin, thermosetting resin or liquid curable resin, including polyester resin, polyimide resin, urethane resin, epoxy resin, silicone resin, acryl resin, fluorinated resin, phenol resin, etc., among which polyester resin is particularly preferable in order to make conductor wiring resistant to bending.

The larger the molecular weight of a resin, the higher the viscosity of the electrically conductive paste made using the resin. Therefore, it is preferable to set the molecular weight of the resin so as to obtain optimum viscosity for the printing method employed for forming the conductor wiring.

For example, when the conductor wiring is formed by screen printing using a polyester resin as the binder, it is preferable to select a polyester resin that has a proper molecular weight not less than 20000, in order to render thixotropy to the electrically conductive paste and increase its viscosity under condition of no external force applied thereto. Since variety of the molecular weights of the available polyester resins is limited, two or more kinds of polyester resins of different molecular weights may be blended.

(Electrically Conductive Paste)

The electrically conductive paste is prepared by mixing the metal particles and the binder with a proper solvent in predetermined ratio as usual. The solvent may be omitted by using a binder such as liquid curable resin that shows fluidity during printing. When the curable resin or the liquid curable resin is used, a curing agent, cross-linking agent or the like suitable for the curing reaction may be mixed.

For the solvent, various solvents that can satisfactorily dissolve the binder can be used. But it is preferable to use a solvent that is suited to both the binder and the printing method to be employed. In case a polyester resin is used as the binder to form the conductor wiring by screen printing, it is preferable to use a solvent that has medium to high boiling point such as cellosolve or carbitol, in order to prevent the electrically conductive paste from drying and solidifying too quickly. Such solvents include ethyl cellosolve acetate, butyl cellosolve acetate, butylcarbitol, butyl cellosolve, ethylcarbitol, ethylcarbitol acetate, butylcarbitol acetate and terpineol.

While there is no restriction on the ratio of the metal particles in the electrically conductive paste, it is preferable that ratio of the metal particles is lower than the volume ratio of the metal particles M and the binder B, M/B=1.9/1, similarly to the case of a second printed wiring board to be described later, in order to increase the bonding strength of the conductor wiring with the board and increase the strength of the conductor wiring itself, so as to prevent peel-off and line breakage when the flexible printed wiring board is bent during use.

The electrically conductive paste is prepared so as to obtain viscous property that is suitable for the printing method employed to form the conductor wiring.

Desired viscous property of the electrically conductive paste for screen printing is, for example, the so-called thixotropy that shows low viscosity when subjected to an external force such as stirring by a squeeze, but maintains a high viscosity when left to stand without external force.

Specifically, when the viscosity is measured at different rotational speeds using a cone plate type viscosity meter and the measured values of viscosity are plotted against the rotational speeds along logarithmic scale, it is required that the plots lie on a straight line of a definite gradient or are distributed in the vicinity of such a straight line.

During the screen printing process, the electrically conductive paste is caused by the squeegee to move over the screen while rotating in the so-called rolling motion.

This state corresponds to a low viscosity of the electrically conductive paste as measured by the cone plate type viscosity meter during high speed rotation, such that the electrically conductive paste is supplied through the apertures formed in a predetermined pattern in the screen onto the board, and is printed in the pattern of the conductor wiring.

The electrically conductive paste that has been printed on the board becomes standstill when the external force is removed.

This state corresponds to a high viscosity of the electrically conductive paste as measured by the cone plate type viscosity meter during low speed rotation, such that the electrically conductive paste maintains the printed pattern.

There are no criteria that dictate which level of viscosity at a particular rotational speed in the cone plate type viscosity meter corresponds to the viscosity of high speed rotation or low speed rotation described above, which should be determined case by case.

In the present invention, viscosity at a rotational speed of 50 rpm will be defined as the viscosity of high speed rotation and viscosity at rotational speed of 1 rpm will be defined as the viscosity of low speed rotation. And the viscous property of the electrically conductive paste is controlled so that viscosity of high speed rotation becomes 20 Pa·s or higher, preferably from 30 to 60 Pa·s, and viscosity of low speed rotation becomes 300 Pa·s or higher, preferably from 400 to 800 Pa·s.

In order to make the electrically conductive paste having such a viscous property as described above by using a polyester resin of molecular weight in a range from 20000 to 30000 as the binder B, while mixing the metal particles M and the binder B in volume ratio of M/B in a range from 1/1 to 1.9/1, for example, solvent T may be mixed with the binder B in weight ratio of B/T=30/70 to 40/60.

When the electrically conductive paste is prepared by stirring and mixing the components described above, manual stirring, centrifugal or revolutionary stirring, mixing and kneading by —roller press or the like may be combined.

(Formation of Conductor Wiring)

In order to print the electrically conductive paste and form the conductor wiring on the board by using the electrically conductive paste described above, various printing methods as usual may be employed, while screen printing is preferable.

In screen printing, a screen of fine mesh in a range from 400 to 500 mesh is preferably used to meet the requirement for smaller line pitch of the conductor wiring. Other printing conditions may be similar to those of usual screen printing.

The conductor wiring that has been printed on the board is dried to solidify. If the binder is the curable resin or the liquid curable resin, the resin is cured.

Thus the first printed wiring board of the present invention is manufactured.

In case the board that has been treated by the method (4) is used, it is necessary to remove the metal layer from the portion other than that where the conductor wiring is formed by selective etching after forming the conductor wiring by printing, in order to prevent short circuiting between conductors and other troubles, after forming the conductor wiring. Specifically, the metal layer exposed out of the region where the conductor wiring is formed may be removed by selective etching by using the conductor wiring as the resist film.

Normally two or more printed wiring boards are made from one board for printed wiring of standard size for the reason of productivity, and the printed wiring board of the present invention is preferably manufactured similarly. In this case, after forming a plurality of conductor wirings, each corresponding to the printed wiring board, on the surface of the board for printed wiring, the board for printed wiring may be punched through so as to separate it into the printed wiring boards each having the predetermined configuration.

<Printed Wiring Board II and Method of Manufacturing the Same>

A second printed wiring board of the present invention is made by forming the conductor wiring by a printing method using the electrically conductive paste that contains metal particles M as the electrically conductive filler and the binder B in volume ratio of M/B in a range from 1/1 to 1.9/1 on the surface (either on one side or both sides) of the board for printed wiring that has been processed by one of the surface treatments (1) to (4), then exposing the metal particles on the surface by etching the conductor wiring at least on the portion used for the connection with an external circuit, and forming a plating layer thereon.

The method of manufacturing a printed wiring board according to the present invention comprises the steps of: preparing the electrically conductive paste that contains metal particles and the binder; forming the conductor wiring by a printing method using the electrically conductive paste described above on the surface of the board for printed wiring that has been processed by one of the surface treatments (1) to (4); exposing the metal particles on the surface by etching the conductor wiring at least on the portion used for the connection with an external circuit; and forming a plating layer on the surface of the conductor wiring where the metal particles have been exposed by etching.

[Electrically Conductive Paste]

The reason for restricting the volume ratio M/B of the metal particles and the binder within the range from 1/1 to 1.9/1 is as described previously.

The metal particles are preferably made of at least one kind of metal selected from among the group consisting of Al, Ni, Cu, Ag and Au, having metal particles having an average particle diameter of 4 μm or smaller and maximum particle diameter of 15 μm or smaller, and more preferably metal particles of spherical or granular shape having an average particle diameter of 1 μm or smaller and maximum particle diameter of 4 μm or smaller, for the same reason for that of the first printed wiring board.

Various compounds such as thermoplastic resin, thermosetting resin or liquid curable resin may be used as the binder, including polyester resin, polyimide resin, urethane resin, epoxy resin, silicone resin, acrylic resin, fluorinated resin, phenol resin, etc.

Among those described above, polyester resin is particularly preferable in order to make the conductor wiring resistant to bending against the plating solution when forming the plating layer on the conductor wiring.

When the conductor wiring is formed by screen printing using a polyester resin as the binder, it is preferable to select a polyester resin that has a proper molecular weight not less than 20000, for the same reason as that of the case of the first printed wiring board. Two or more kinds of polyester resins of different molecular weights may be blended, as required.

The electrically conductive paste is prepared by mixing the metal particles and the binder with a proper solvent in predetermined ratio. The solvent may be omitted by using a binder such as liquid curable resin that shows fluidity during printing. When the curable resin or the liquid curable resin is used, a curing agent, cross-linking agent or the like suitable for the curing reaction may be mixed.

For the solvent, it is preferable to use a solvent that is suited to both the binder and the printing method to be employed. In case a polyester resin is used as the binder to form the conductor wiring by screen printing, it is preferable to use a solvent that has medium to high melting point such as cellosolve or carbitol, for the same reason as that of the case of the first printed wiring board. Such solvents include ethyl cellosolve acetate, butyl cellosolve acetate, butylcarbitol, butyl cellosolve, ethylcarbitol, ethylcarbitol acetate, butylcarbitol acetate and terpineol.

In order to render thixotropy suited to screen printing, the viscous property of the electrically conductive paste is preferably controlled so that viscosity at high speed rotation of 50 rpm becomes 20 Pa·s or higher, preferably from 30 to 60 Pa·s, and viscosity at low speed rotation of 1 rpm becomes 300 Pa·s or higher, preferably from 400 to 800 Pa·s, as measured by the cone plate type viscosity meter.

For example, a polyester resin of molecular weight from 20000 to 30000 is used as the binder B, and metal particles M and the binder B are mixed in volume ratio of M/B in a range from 1/1 to 1.9/1. In case the electrically conductive paste having the viscous property described above is to be made, solvent T may be mixed with the binder B in a weight ratio of B/T=30/70 to 40/60.

When the electrically conductive paste is prepared by stirring and mixing the components described above, manual stirring, centrifugal or revolutionary stirring, mixing and kneading by roller press or the like may be combined.

(Formation of Conductor Wiring)

In order to print the electrically conductive paste and form the conductor wiring on the board, various printing methods as usual may be employed, while screen printing is preferable.

In screen printing, a screen of fine mesh, particularly a screen of mesh size from 400 to 500 mesh is preferably used to meet the requirement for smaller line pitch of the conductor wiring. Other printing conditions may be similar to those of usual screen printing.

The conductor wiring that has been printed on the board is dried to solidify. If the binder is the curable resin or the liquid curable resin, the resin is cured.

In case the board has been treated by the method (4) is used, the metal layer may be removed from the portion other than that where the conductor wiring is formed by selective etching after forming the conductor wiring, in order to prevent short circuiting between conductor or other troubles, similarly as described previously.

The unnecessary portion of the metal layer may also be removed during the step of etching the conductor wiring to be described below.

(Etching Process)

Then according to the present invention, of the conductor wiring formed as described above, at least a portion used in connection with the external circuit is etched to remove the binder from the surface, so as to expose the metal particles.

Etching of gas phase reaction such as reactive ion etching or various plasma treatments may be employed for this etching process.

However, more simple etching of liquid phase reaction may suffice since it is required only to remove the thin binder film that covers the surface of the metal particles located near the surface of the conductor wiring and expose the metal particles. That is, etching of the required portion of the conductor wiring can be completed simply by immersing the board in which the portion of the conductor wiring to be etched is exposed and the other portions are protected with a cover lay film or the like in an etching solution for a predetermined period of time.

For the etching solution, it is preferable to use a solution having strong oxidizing power such as potassium permanganate, in order to surely expose the metal particles in a treatment of short time.

The surface of the metal particles that has been exposed by etching may be covered by an oxide film as the metal is oxidized by the etching solution. Therefore, it is preferable to wash the board in water after etching and apply reduction treatment with a reducing agent so as to remove the oxide film from the surface of the metal particles.

[Formation of Plating Layer]

Then the surface of the conductor wiring where the metal particles has been exposed by etching is coated with a plating layer.

While either electroplating or electroless plating may be employed, it is preferable to employ electroless plating as mentioned previously.

Before plating, the board is immersed in a solution having oxidizing power for a short period of time (about 5 to 60 seconds) to prepare the surface, and is then washed in water.

Then the board is subjected to soft etching process in order to remove the oxide film formed on the surface of the metal particles.

When Cu coat is to be formed, the board is immersed in an electroless Cu plating solution for about one hour. This results in a Cu coat about 2 µm in thickness formed selectively on the conductor wiring due to the action of the metal particles that are exposed on the surface of the conductor wiring.

In case the metal particles distributed in the conductor wiring are Ag particles, it is difficult to form the Cu coat directly on the conductor wiring by electroless Cu plating since Ag is more electrochemically noble than Cu. In this case, it is preferable to employ the catalyzing process that is utilized in electroless plating onto plastics.

There may be such cases as a Cu coat can be formed more stably by applying the catalyzing process in electroless Cu plating when the metal particles are not Ag.

In case an Au coat that is suited to connection by means of anisotropically conductive film is formed as the plating layer, electroless Ni—Au plating is preferably employed.

In the electroless Ni—Au plating, the board having the Cu coat plated on the conductor wiring is immersed in an electroless Ni plating solution so as to form an Ni coat about 1 µm thickness selectively on the Cu coat. After being washed in water, the board is then immersed in Au-substitution plating solution for about 10 minutes so as to substitute Ni located on the surface of the Ni-plated coating by Au, thereby forming Au coat about 0.05 µm thickness.

The second printed wiring board of the present invention can be manufactured in the process described above.

The plating layer may be formed either only on the portion used for connection with the external circuit of the conductor wiring or over the entire conductor wiring. To sum up, appropriate constitution may be selected in accordance to the specifications of the printed wiring board.

According to the present invention, two or more printed wiring boards are made from one board for printed wiring of standard size for the reason of productivity, and the printed wiring board of the present invention is preferably manufactured similarly. In this case, after forming a plurality of conductor wirings each corresponding to the printed wiring board on the surface of the board for printed wiring, the board for printed wiring may be punched through so as to separate it into the printed wiring boards each having the predetermined configuration.

EXAMPLES

Now the present invention will be described in more detail below by way of Examples and Comparative Examples.

<Board for Printed Wiring>

Example 1

Commercially available polyimide film (Kapton® EN, 25 µm thickness, manufactured by DuPont-Toray Co., Ltd.) was used as the board.

(Surface Roughening Treatment)

The board for printed wiring of Example 1 was made by applying surface roughening treatment to one side of the board described above by wet blasting, under the following conditions.

Abrasive particles: Alumina particles (Median particle diameter 6 to 7 µm)
Pumping pressure: 0.1 MPa
Air pressure: 0.25 MPa
Processing speed: 30 mm/s
Projecting distance: 50 mm
Projection angle: 90°

Measurement of the profile of the surface that has been subjected to surface roughening treatment with a laser microscope showed center line average roughness Ra of 68 nm.

Example 2

A polyimide film obtained by removing Cu foil from a commercialized Cu-clad laminate board (comprising polyimide film and rolled Cu foil) was used as the board. The surface of the polyimide film from which the Cu foil was removed was used as a model of a surface subjected to surface roughening treatment.

The center line average roughness Ra of the surface described above measured similarly to Example 1 was 88 nm.

Comparative Example 1

The same untreated polyimide film as that used in Example 1 was used as the board for printed wiring of Comparative Example 1 without applying surface roughening treatment. The center line average roughness Ra of the surface on one side of this board measured similarly to Example 1 was 0.5 nm.

[Formation of Conductor Wiring]

The electrically conductive paste was applied to the surface of the boards for printed wiring of Examples 1 and 2 that were subjected to surface roughening treatment and to the surface of the board for printed wiring of Comparative Example 1 of which profile was measured, in the pattern of the conductor wiring having fine wiring portion consisting of fine lines 30 µm in width at a space of 30 µm from each other (hereinafter referred to as 60 µm pitch) by using a screen printing machine (LS-150 manufactured by NEWLONG SEIMITSU KOGYO CO., LTD.). The conductor wiring was completed by baking the electrically conductive paste at 150° C. for 20 minutes.

The electrically conductive paste was made by mixing Ag particles M of substantially spherical shape 0.5 µm in average particle diameter and 2 µm in maximum particle diameter and a polyester resin (molecular weight 20000 to 30000) as a binder B in weight ratio of M/B=1.2/1, and dissolving this mixture and blocked isocyanate (curing temperature 140° C.) used as a curing agent in butylcarbitol acetate used as a solvent. Ratio of the curing agent was set to the theoretical equivalent to the polyester resin. Weight ratio of the solvent T to the binder B was set to B/T=35/65.

The components described above were mixed first manually then by means of a mixer, and kneaded uniformly by a three-roll kneader to make the electrically conductive paste.

The electrically conductive paste showed viscosity of 34 Pa·s at rotational speed of 50 rpm and 407 Pa·s at rotational speed of 1 rpm as measured by the cone plate type viscosity meter.

The printing conditions were as follows.

Screen: 500 mesh of stainless steel wires (wire diameter 18 µm, aperture size 32.8 µm, bias angle 30°)
Screen frame: 320 mm square
Printed pattern forming area: Within 100 mm square at the center of frame
Squeezing pressure
Front pressure: 0.15 MPa
Back pressure: 0.07 MPa
Squeezing speed: 30 mm/sec.
Squeezing angle: 70°
Clearance: 1.5 mm

[Observation and Measurement of Conductor Wiring]

A fine wiring portion of the conductor wiring that was formed was observed with a stereoscopic microscope and photographed. Microscopic photograph of Example 1 is shown in FIG. 1 and microscopic photograph of Comparative Example 1 is shown in FIG. 2.

Maximum line width was determined by reading from the photograph, and the minimum spacing was determined by subtracting the maximum line width from the pitch of 60 µm. The results are shown in Table 1.

TABLE 1

Figure 2:
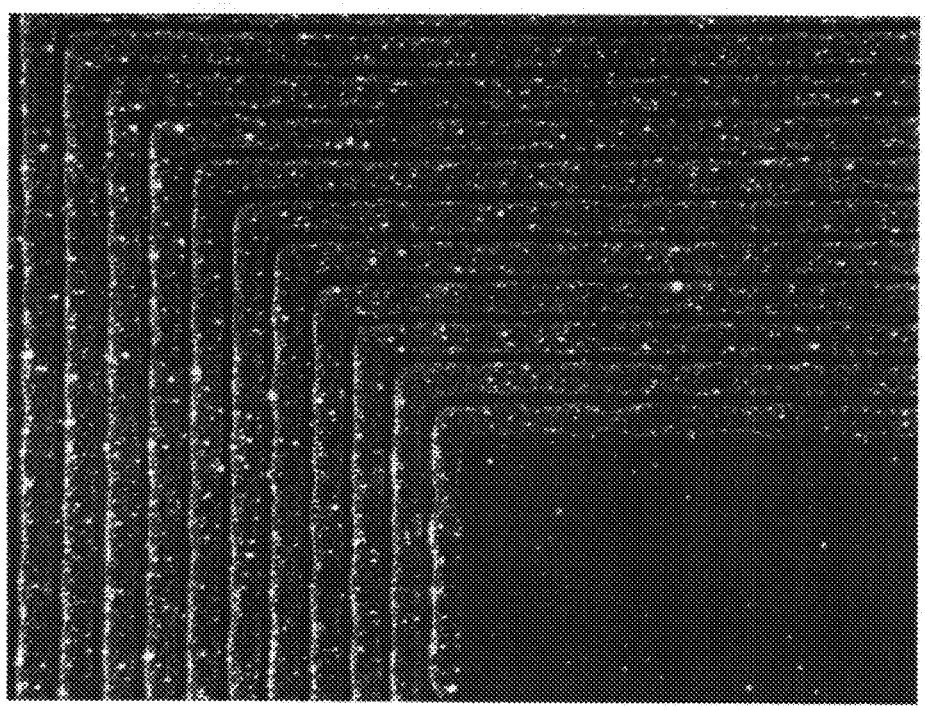
FIG. 2 is a photograph taken with a stereoscopic microscope of a fine wiring portion of a conductor wiring printed by using an electrically conductive paste on the surface of a board for printed wiring fabricated in Comparative Example 1 without surface treatment.

| | Maximum line width (µm) | Minimum spacing (µm) | Photograph |
|---|---|---|---|
| Example 1 | 43.7 | 16.3 | FIG. 1 |
| Example 2 | 43.0 | 17.0 | — |
| Comparative Example 1 | 51.1 | 8.9 | FIG. 2 |

Table 1 shows that line width of the conductor wiring of Comparative Example 1 is larger than design (30 µm). FIG. 2 shows that, in Comparative Example 1, as a result of the larger line width, adjacent lines come too close to or touch each other at a number of points.

Table 1 and FIG. 1 show that Examples 1 and 2 are capable of suppressing the lines from expanding unlike Comparative Example 1.

In the photographs, narrow linear areas of a color different from that of the rectangular region at the bottom right are the conductor lines. The smaller the width of the line and the larger the width of the area having the same as that of the rectangular region at the bottom right, the better the conductor wiring without spreading. The same applies in the following cases.

Examples 3, 4

Untreated polyimide resin sheets with smooth surface were used as the board.

(Plasma Treatment)

Plasma treatment was carried out using a plasma treatment apparatus comprising a vacuum chamber and a pair of parallel plate electrodes and a board holder disposed in the vacuum chamber.

With the board mounted on the board holder so as to be exposed to the plasma, the vacuum chamber was closed and pumped vacuum till the pressure decreased to $1 \times 10^{-3}$ Pa. Then $N_2$ gas was introduced into the vacuum chamber and controlled the pressure to 0.2 Pa. $N_2$ gas was introduced at a flow rate of 20 sccm.

Then a DC voltage was applied to the pair of parallel plate electrodes to generate low temperature plasma in the vacuum chamber. Thus the exposed surface of the board held by the board holder was subjected to plasma treatment thereby making the boards for printed wiring of Examples 3 and 4.

The plasma treatment was carried out by supplying 100 W (power density 0.09 W/cm$^2$) of power for one minute (Example 3) and 300 W (power density 0.27 W/cm$^2$) of power for one minute (Example 4).

[Formation, Observation and Measurement of Conductor Wiring]

Conductor wirings were formed in the same shape under the same conditions as those described previously, on the surfaces that had been treated by plasma of the boards for printed wiring for Examples 3 and 4.

A fine wiring portion of the conductor wiring that was formed was observed with a stereoscopic microscope and photographed. Microscopic photograph of Example 3 is shown in FIG. 3.

Maximum line width was determined by reading from the photograph, and the minimum spacing was determined by subtracting the maximum line width from the pitch of 60 µm. The results are shown in Table 2.

TABLE 2

Figure 3:
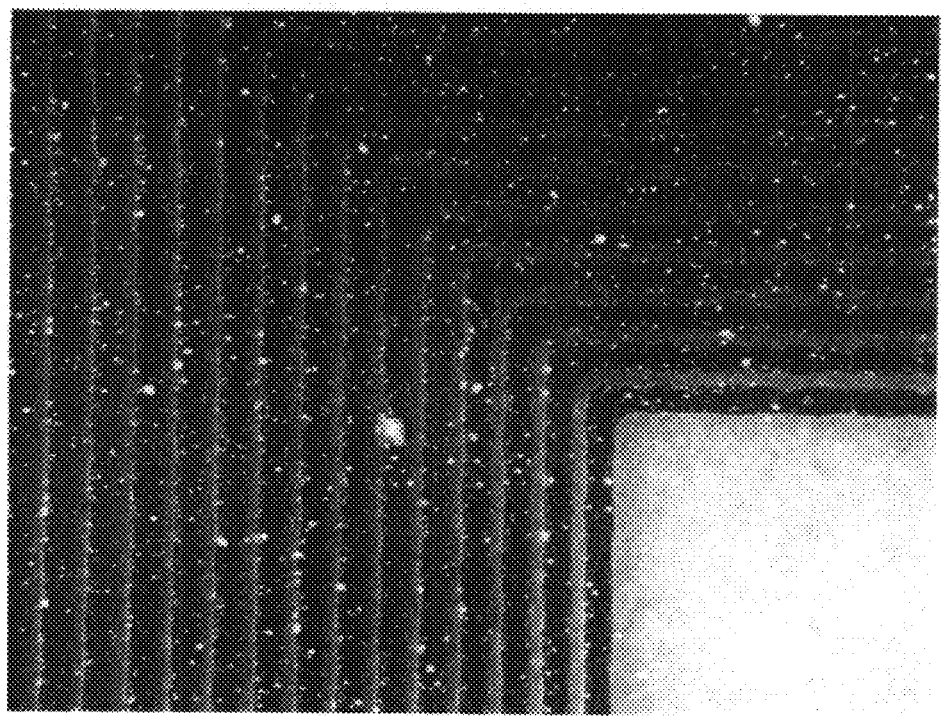
FIG. 3 is a photograph taken with a stereoscopic microscope of a fine wiring portion of a conductor wiring printed by using an electrically conductive paste on the surface of a board for printed wiring fabricated in Example 3 after plasma treatment.

| | Maximum line width (µm) | Minimum spacing (µm) | Photograph |
|---|---|---|---|
| Example 3 | 45.4 | 14.6 | FIG. 3 |
| Example 4 | 43.8 | 16.2 | — |

Table 2 and FIG. 3 show that Examples 3 and 4 are capable of suppressing the lines from expanding unlike Comparative Example 1 (FIG. 2).

Examples 5, 6

The same polyimide film as that used in Example 1 was used as the board.

Surface roughening treatment was applied to one side of the board similarly to Example 1. Example 5 was treated under the same conditions as Example 1 resulting in center line average roughness Ra of 68 nm for the treated surface. Example 6 was treated under the same conditions as Example 1, except for changing the air pressure to 0.3 MPa and the processing speed to 60 mm/s, with the center line average roughness Ra of 146 nm for the treated surface.

The plasma treatment was applied to the surface of the board described above that has been subjected to surface roughening treatment under the same conditions as Example 4 (300 W for one minute), thereby making the board for printed wiring of Examples 5, 6.

[Formation, Observation and Measurement of Conductor Wiring]

Conductor wirings were formed in the same shape under the same conditions as those described previously, on the treated surfaces of the boards for printed wiring for Examples 5 and 6.

The fine wiring portion of the conductor wiring that was formed was observed with a stereoscopic microscope and photographed. Microscopic photograph of Example 6 is shown in FIG. 4.

Maximum line width was determined by reading from the photograph, and the minimum spacing was determined by subtracting the maximum line width from the pitch of 60 μm. The results are shown in Table 3.

TABLE 3

Figure 4:
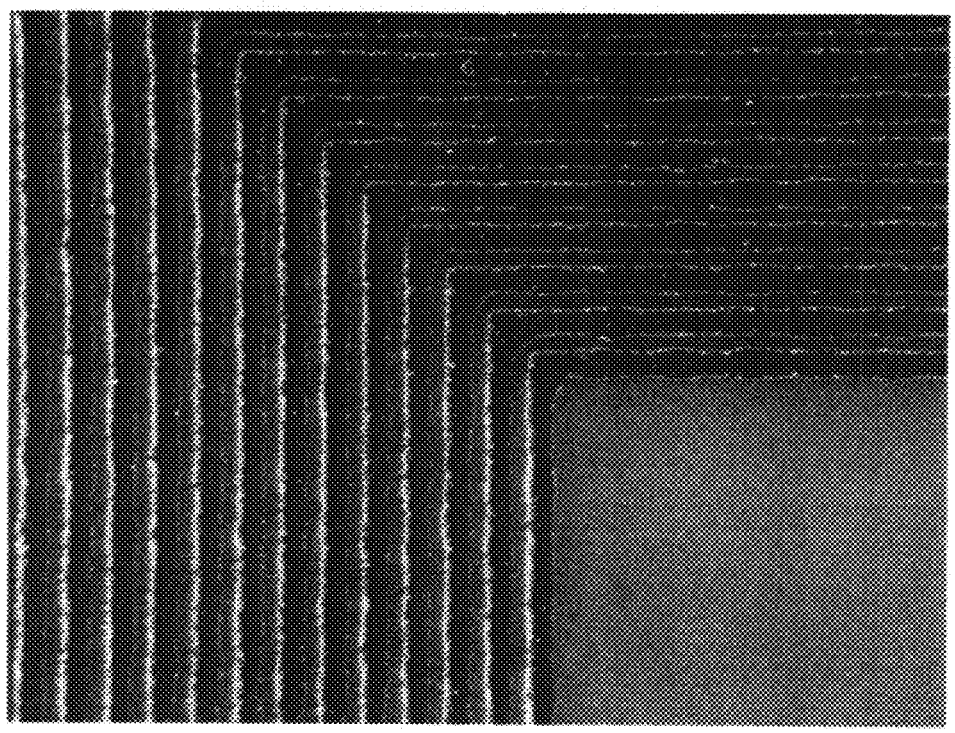
FIG. 4 is a photograph taken with a stereoscopic microscope of a fine wiring portion of a conductor wiring printed by using an electrically conductive paste on the treated surface of a board for printed wiring fabricated in Example 6.

|  | Maximum line width (μm) | Minimum spacing (μm) | Photograph |
| --- | --- | --- | --- |
| Example 5 | 39.7 | 20.3 | — |
| Example 6 | 46.5 | 13.5 | FIG. 4 |

Table 3 and FIG. 4 show that Examples 5 and 6 are capable of suppressing the lines from expanding unlike Comparative Example 1 (FIG. 2).

Examples 7 to 9

Commercially available polyimide film (Upirex® VT manufactured by Ube Industries, Ltd.) was used as the board.

Surface roughening treatment was applied to one side of the board similarly to Example 1.

Example 7 was treated under the same conditions as Example 1, except for changing the air pressure to 0.1 MPa, with the center line average roughness Ra of 45 nm for the treated surface.

Example 8 was treated under the same conditions as Example 1, with the center line average roughness Ra of 68 nm for the treated surface.

Example 9 was treated under the same conditions as Example 1, except for changing the median particle diameter of the abrasive particles to 14 μm, the pumping pressure to 0.13 MPa, the air pressure to 0.3 MPa and the processing speed to 60 mm/s with the in center line average roughness Ra of 85 nm for the treated surface.

The plasma treatment was applied to the surface of the board described above that had been subjected to surface roughening treatment under the same conditions as Example 4 (300 W for one minute), thereby making the boards for printed wiring of Examples 7 to 9.

Comparative Example 2

The same untreated polyimide film as that used in Examples 7 to 9 was used as the board for printed wiring of Comparative Example 2. The center line average roughness Ra of the surface on one side of this board measured similarly to Example 1 was 0.5 nm.

[Formation, Observation and Measurement of Conductor Wiring]

Conductor wiring was formed in the same shape under the same conditions as those described previously, on the treated surface of the board for printed wiring in Examples 7 to 9 and the surface of the board for printed wiring of Comparative Example 2 of which surface profile was measured.

The fine wiring portion of the conductor wiring that was formed was observed with a stereoscopic microscope and photographed. Microscopic photograph of Example 8 is shown in FIG. 5, and microscopic photograph of Comparative Example 2 is shown in FIG. 6.

Maximum line width was determined by reading from the photograph, and the minimum spacing was determined by subtracting the maximum line width from the pitch of 60 μm. The results are shown in Table 4.

TABLE 4

Figure 5:
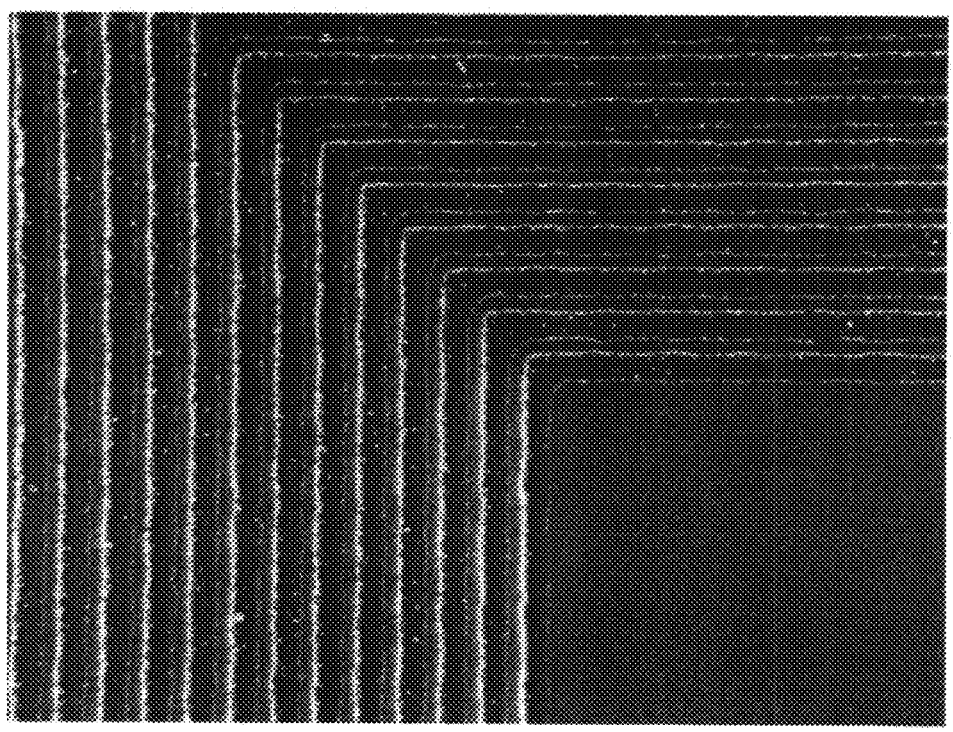
FIG. 5 is a photograph taken with a stereoscopic microscope of a fine wiring portion of a conductor wiring printed by using an electrically conductive paste on the treated surface of a board for printed wiring fabricated in Example 8
Figure 6:
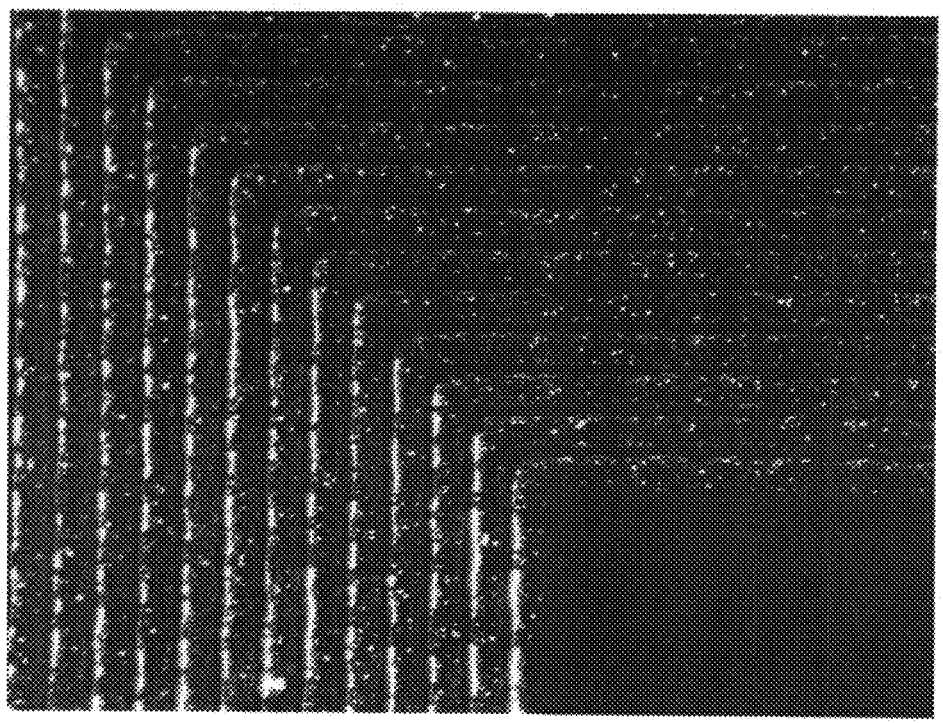
FIG. 6 is a photograph taken with a stereoscopic microscope of a fine wiring portion of a conductor wiring printed by using an electrically conductive paste on the surface of a board for printed wiring fabricated in Comparative Example 2 without surface treatment.

|  | Maximum line width (μm) | Minimum spacing (μm) | Photograph |
| --- | --- | --- | --- |
| Example 7 | 48.0 | 12.0 | — |
| Example 8 | 42.4 | 17.6 | FIG. 5 |
| Example 9 | 44.9 | 15.1 | — |
| Comparative Example 2 | 54.9 | 5.1 | FIG. 6 |

Table 4 shows that line width of the conductor wiring of Comparative Example 2 is larger than design (30 μm). FIG. 6 shows that, in Comparative Example 2, as a result of the larger line width, adjacent lines come too close to or touch each other at a number of points.

Table 4 and FIG. 5 show that Examples 7 to 9 are capable of suppressing the lines from expanding unlike Comparative Example 2.

Examples 10 to 12

The same polyimide film as that used in Example 1 was used as the board.

Surface roughening treatment was applied to one side of the board similarly to Example 1.

Example 10 was treated under the same conditions as Example 7 with the center line average roughness Ra of 45 nm for the treated surface.

Example 11 was treated under the same conditions as Example 1, with the center line average roughness Ra of 68 nm for the treated surface.

Example 12 was treated under the same conditions as Example 6, with the center line average roughness Ra of 147 nm for the treated surface.

(Formation of Metal Coating)

The metal layer was formed by using a sputtering apparatus of opposing cathode sputtering method comprising a vacuum chamber having the following construction.

Two Ni targets were disposed to oppose in parallel to each other in the vacuum chamber.

A board holder was disposed at a position where the sputtered Ni particles released from the target can reach, outside the space between the two Ni targets, where the surface of the board could face upward.

With the board mounted on the board holder so that the surface thereof that has been subjected to the surface roughening treatment is exposed, the vacuum chamber was closed and pumped vacuum till the pressure decreased to 1×10⁻³ Pa. Then Ar gas was introduced into the vacuum chamber and controlled the pressure to 0.133 Pa. Ar gas was introduced at a flow rate of 10 sccm.

Then a DC voltage was applied across the two targets used as the cathode and the board as the anode, to generate low temperature plasma in the vacuum chamber. Thus Ni coat was formed by sputtering on the surface of the board that was subjected to the surface roughening treatment, thereby making the board for printed wiring of Examples 10 to 12.

Duration of the coating process was set to one minute, and input DC power was set to 0.5 kW.

Thickness of the Ni layer, measured by observing a cross section with a high-resolution scanning electron microscope, was 150 Å.

Example 13

The same polyimide film as that used in Examples 7 to 9 was used as the board.

Surface roughening treatment was applied to one side of the board under the same conditions as Example 9 resulting in center line average roughness Ra of 85 nm.

An Ni layer having thickness of 150 Å was formed on the surface of the board that was subjected to surface roughening treatment under the same conditions as those of Examples 10 to 12, thereby making the board for printed wiring of Example 13.

[Formation, Observation and Measurement of Conductor Wiring]

Conductor wiring was formed in the same shape under the same conditions as those described previously, on the surface of the board for printed wiring treated in Examples 10 to 13.

The fine wiring portion of the conductor wiring that was formed was observed with a stereoscopic microscope and photographed. Microscopic photograph of Example 11 is shown in FIG. 7.

Maximum line width was determined by reading from the photograph, and the minimum spacing was determined by subtracting the maximum line width from the pitch of 60 μm. The results are shown in Table 5.

TABLE 5

Figure 7:
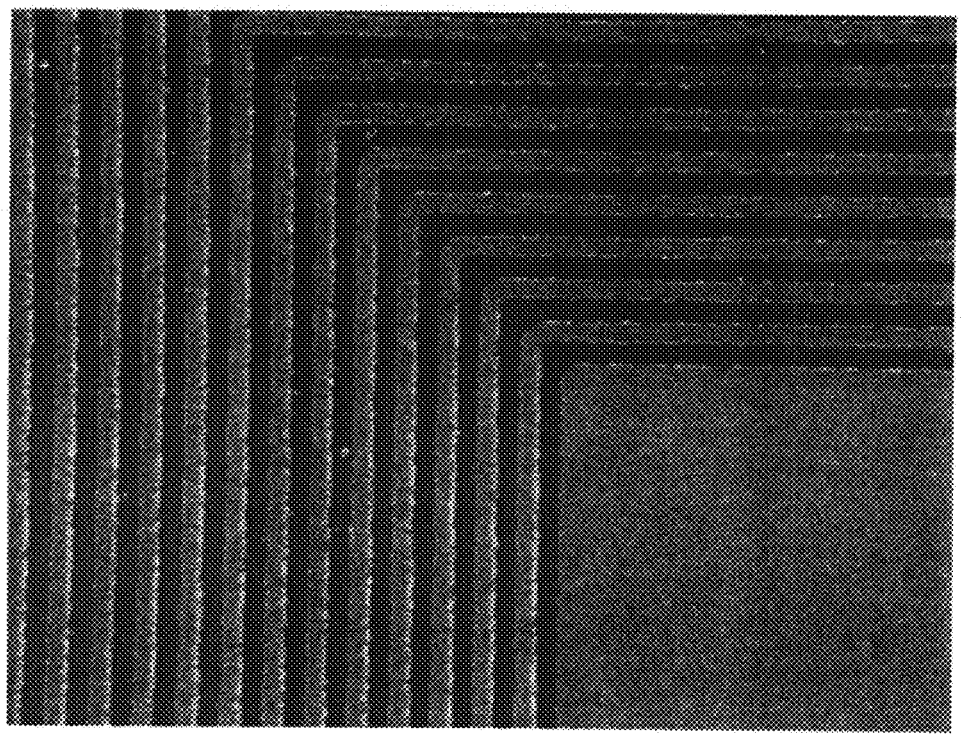
FIG. 7 is a photograph taken with a stereoscopic microscope of a fine wiring portion of a conductor wiring printed by using an electrically conductive paste on the treated surface of a board for printed wiring fabricated in Example 11.

|  | Maximum line width (μm) | Minimum spacing (μm) | Photograph |
|---|---|---|---|
| Example 10 | 48.7 | 11.3 | — |
| Example 11 | 23.4 | 36.6 | FIG. 7 |
| Example 12 | 26.3 | 33.7 | — |
| Example 13 | 32.2 | 27.8 | — |

Table 5 and FIG. 7 show that Examples 10 to 13 are capable of suppressing the lines from expanding unlike Comparative Example 1 (FIG. 2).

<Printed Wiring Board I>

Example 14

Preparation of Electrically Conductive Paste

The electrically conductive paste was made by mixing Ag particles of substantially spherical shape having an average particle diameter of 0.5 μm and maximum particle diameter of 2 μm as an electrically conductive filler, a polyester resin (molecular weight from 20000 to 30000) as a binder, blocked isocyanate (curing temperature 140° C.) used as a curing agent and butylcarbitol acetate used as a solvent, and mixing, first manually then by means of a mixer, and kneading the mixture uniformly by a three-roll kneader.

Volume ratio of the Ag particles M and the polyester resin as the binder B was set to M/B=1.2/1. Ratio of the curing agent was set to the theoretical equivalent to the polyester resin. Weight ratio of the solvent T to the binder B was set to B/T=35/65.

The electrically conductive paste showed viscosity of 34 Pa·s at rotational speed of 50 rpm and 407 Pa·s at rotational speed of 1 rpm as measured by the cone plate type viscosity meter.

(Fabrication of Printed Wiring Board)

Printed wiring boards were made by printing the electrically conductive paste using a screen printing machine (MT-320TVC manufactured by Micro-tec Co., Ltd.) on the surface of the same board for printed wiring as that made in Example 1 that was subjected to surface roughening treatment, in a pattern of conductor wiring having the fine wiring portion of three different pitches as described below and heating at 150° C. for 20 minutes, thereby baking the electrically conductive paste and forming the conductor wiring.

Line width 110 μm and space between lines 110 μm (hereinafter referred to as 220 μm pitch);

Line width 40 μm and space between lines 40 μm (hereinafter referred to as 80 μm pitch); and Line width 25 μm and space between lines 25 μm (hereinafter referred to as 50 μm pitch)

The printing conditions were as follows.

Screen: 500 mesh of stainless steel wires (wire diameter 18 μm, aperture size 32.8 μm, bias angle 30°)

Screen frame: 320 mm square

Printed pattern forming area: Within 100 mm square at the center of frame

Squeezing pressure

Front pressure: 0.175 MPa

Back pressure: 0.10 MPa

Squeezing speed: 30 mm/sec.

Squeegee angle: 70°

Clearance: 0.97 mm

Example 15

The electrically conductive paste was prepared similarly to Example 14, except for using the same quantity of Ag particles of substantially spherical shape having an average particle diameter of 1 μm and maximum particle diameter of 4 μm as an electrically conductive filler to be contained in the electrically conductive paste, and printed wiring board was made by forming the conductor wiring of the same shape on the surface of the same board for printed wiring as that made in Example 1 that was subjected to surface roughening treatment similarly to Example 14.

Example 16

The electrically conductive paste was prepared similarly to Example 14, except for using the same quantity of Ag particles of flat shape having an average particle diameter of 2 μm and maximum particle diameter of 7 μm as an electrically conductive filler to be contained in the electrically conductive paste, and printed wiring board was made by forming the conductor wiring of the same shape on the surface of the same board for printed wiring as that made in Example 1 that was subjected to surface roughening treatment similarly to Example 14.

Example 17

The electrically conductive paste was prepared similarly to Example 14, except for using the same quantity of Ag particles of flat shape having an average particle diameter of 4 μm and maximum particle diameter of 15 μm as an electrically conductive filler to be contained in the electrically conductive paste, and printed wiring board was made by forming the conductor wiring of the same shape on the surface of the same board for printed wiring as that made in Example 1 that was subjected to surface roughening treatment similarly to Example 14.

Comparative Example 3

The electrically conductive paste was prepared similarly to Example 14, except for using the same quantity of Ag particles of flat shape having an average particle diameter of 5 μm and maximum particle diameter of 20 μm as an electrically conductive filler to be contained in the electrically conductive paste, and printed wiring board was made by forming the conductor wiring of the same shape on the surface of the same board for printed wiring as that made in Example 1 that was subjected to surface roughening treatment similarly to Example 14.

[Evaluation of Printing Characteristics]

The fine wiring portion of the conductor wiring formed as described above was observed with the stereoscopic microscope. Printing characteristics were evaluated by the following criteria on the fine wiring portions of the three different pitches.

E: The fine wiring portion shows excellent printing characteristics with fine and clear lines, without variation in the line width, meandering of the line, rubbing or blurring.

G: The fine wiring portion shows practically good printing characteristics although there are some variations in the line width and meandering of the line.

B: The fine wiring portion shows bad printing characteristics with rubbing and/or blurring and unclear line edge.

The results are shown in Table 6.

TABLE 6

| | Metal particles | | | Printing characteristic (Pitch) | | | |
|---|---|---|---|---|---|---|---|
| | Particle diameter (μm) | | | | 120 | | 50 |
| | Mean | Max | Shape | 220 μm | μm | 80 μm | μm |
| Example 14 | 0.5 | 2 | Substantially spherical | E | E | E | E |
| Example 15 | 1 | 4 | Substantially spherical | E | E | E | G |
| Example 16 | 2 | 7 | Flat shape | E | E | G | B |
| Example 17 | 4 | 15 | Flat shape | E | E | G | B |
| Comparative Example 3 | 5 | 20 | Flat shape | E | B | B | B |

The table shows that, in the printed wiring board of Comparative Example 3 where Ag particles of flat shape larger than 4 μm in average particle diameter and larger than 15 μm in maximum particle diameter were used as the electrically conductive filler, although the fine wiring portion with 220 μm pitch showed excellent printing characteristics (E), all fine wiring portions of 120 μm or smaller pitches showed bad printing characteristics (B).

The printing characteristics were checked again after cleaning the screen used in Comparative Example 3, but the printing characteristics could not be improved. Observation of the cleaned screen under a microscope showed that Ag particles were stuck in the mesh that could not be removed and blocked the screen.

In Examples 14 and 15 where Ag particles of substantially spherical shape having an average particle diameter of 1 μm or smaller and maximum particle diameter of smaller than 5 μm or smaller were used as the electrically conductive filler, the fine wiring portion with any pitch showed excellent (E) or good (G) printing characteristics, showing that satisfactory conductor wiring was formed.

When the two Examples are compared, Example 15 showed good (G) printing characteristics in the fine wiring portion of 50 μm pitch, while Example 14 showed excellent (E) printing characteristics even in the fine wiring portion of 50 μm pitch. From these facts, it was verified that the printing characteristics are improved and better conductor wiring can be formed as the average particle diameter and the maximum particle diameter of the Ag particles become smaller in the range described above.

In the printed wiring boards of Examples 16, 17 where Ag particles of flat shape having an average particle diameter of 4 μm or smaller with maximum particle diameter of 15 μm or smaller were used as the electrically conductive filler, although the printing characteristics were bad (B) in the fine wiring portion having 50 μm pitch, the printing characteristics were excellent (E) in the fine wiring portion having 120 μm pitch and good (G) in the fine wiring portion having 80 μm pitch, thus proving that relatively good conductor wiring was formed, if not as good as those of Examples 14, 15.

[Continuous Printing Characteristics Test]

Continuous printing for 120 printed wiring boards was carried out under the same conditions as those of Example 14 on the same board for printed wiring as that made in Example 1. 120$^{th}$ of the printed wiring boards made by baking the conductor wirings was observed with stereoscopic microscope, to evaluate the printing characteristics on the fine wiring portion of the three different pitches by the same criteria as described previously, all showing excellent (E) quality.

These results show that printed wiring board having satisfactory conductor wiring formed thereon where lines are smaller in width than the conventional one and divisional lines thereof are clear can be manufactured continuously without blocking the screen, by printing on the board that has undergone surface roughening treatment using the electrically conductive paste which contains substantially spherical Ag particles of which particle diameters are small and less scattered.

<Printed Wiring Board II>

[Examination of Etching Process]

Example 18

(Formation of Conductor Wiring)

The electrically conductive paste was prepared similarly to Example 14, except for using the same quantity of Cu particles having an average particle diameter of 0.5 μm and maximum particle diameter of 2 μm as an electrically conductive filler to be contained in the electrically conductive paste, and conductor wiring having fine wiring portion of 50 μm pitch was formed on the surface of the same board for printed wiring as that made in Example 1 that was subjected to surface roughening treatment similarly to Example 14.

The printed conductor wiring was baked by carrying out preliminary heating at 50° C. for 20 minutes and then main heating at 150° C. for 20 minutes in nitrogen atmosphere.

(Etching Process)

The board having the conductor wiring baked thereon was immersed in potassium permanganate solution at room temperature for 20 to 60 seconds for etching the surface of the conductor wiring, before being carefully washed in water.

Observation of the surface of the conductor wiring before and after etching showed that the surface of the Cu particles located near the surface of the conductor wiring had been covered by a thin film of the binder before etching, but was exposed after etching.

Then the oxide film covering the surface of the exposed Cu particles was removed by reduction process using a reducing agent, and the board was immersed in an electroless Cu plating solution to carry out electroless Cu plating for one hour. This resulted in the formation of satisfactory and continuous Cu plated coat (2 μm thickness) selectively on the surface of the conductor wiring with good reproducibility.

Comparative Example 4

The board was immersed in electroless Cu plating solution to carry out electroless Cu plating for one hour, without etching the surface of the conductor wiring. The Cu plating layer thus formed was a discontinuous one having many pits, and spontaneously flaked off from the surface of the conductor wiring.

Thus, it was verified that satisfactory and continuous Cu plating layer cannot be formed unless the surface of the conductor wiring is etched to expose the Cu particles.

[Examination of Volume Ratio of Cu Particles]

Examples 19 to 21, Comparative Examples 5 to 8

The electrically conductive paste was prepared similarly to Example 18, except for setting the volume ratio M/B of Cu particles M and the polyester resin used as the binder B in the electrically conductive paste to 0.5/1 (Comparative Example 5), 0.75/1 (Comparative Example 6), 1/1 (Example 19), 1.5/1 (Example 20), 1.9/1 (Example 21), 2.2/1 (Comparative Example 7) and 2.5/1 (Comparative Example 8). These electrically conductive pastes were used to form the conductor wiring of the same shape on the surface of the same board for printed wiring as that made in Example 1, that was subjected to surface roughening treatment similarly to Example 18. Electroless Cu plating was carried out after etching the surface of the conductor wiring.

This resulted in the formation of satisfactory and continuous Cu plated coat (2 μm thickness) selectively on the surface of the conductor wiring with good reproducibility in Examples 19 to 21 and Comparative Examples 7 and 8.

However, Comparative Examples 5 and 6 showed similar results to Comparative Example 4. That is, the Cu plating layer that was formed was a discontinuous one having many pits, and spontaneously flaked off from the surface of the conductor wiring.

Then, the fine wiring portion of 50 μm pitch of the printed wiring boards made in Examples 19 to 21 and Comparative Examples 7 and 8 were attached to a fixture having diameter of bend 0.5 mm ϕ with the side of the conductor wiring facing the front. An 180° bending cycle of bending the board by 180° and unfolding it straight was repeated five times and checked for line breakage. Line breakage occurred in Comparative Examples 7 and 8, but not at all in Examples 19 to 21.

Electroless Ni—Au plating was applied to the surface of the Cu plating layer of the printed wiring boards made in Examples 19 to 21 and Comparative Examples 7 and 8.

Specifically, the printed wiring boards of Examples and Comparative Examples were immersed in an electroless Ni plating solution to form an Ni plating layer about 1 μm thickness on Cu plated coat. After washing in water, the printed wiring boards were immersed in Au substitution plating solution for about 10 minutes so as to substitute Ni on the surface of the plated layer by Au, thereby forming Au plated coat about 0.05 μm thickness.

This resulted in the formation of satisfactory and continuous Ni—Au composite plating layer selectively on the surface of the Cu plating layer with good reproducibility in Examples 19 to 21 and Comparative Examples 7 and 8.

Then peeling test was conducted on the plating coats using adhesive cellophane tape, and the plating coat peeled off in Comparative Examples 7 and 8. Observation of the peeled-off surface showed that it was not the interface between the conductor wiring and the plating layer, but inside peeling of the conductor wiring.

In contrast, no peel-off occurred in Examples 19 to 21.

These results show that such a conductor wiring can be formed that has sufficient strength of bonding with the board and the plating layer, when the volume ratio M/B of Cu particles M and the polyester resin used as the binder B in the electrically conductive paste is set in a range from 1/1 to 1.9/1.

(Bonding Test)

Example 22

The same electrically conductive paste as that used in Example 18 was used to form the conductor wiring that has a connection portion of 50 μm pitch on the surface of the same board for printed wiring as that made in Example 1 that was subjected to surface roughening treatment. The surface of the connecting portion of the conductor wiring, after being etched, was coated with Cu by electroless Cu plating. The Cu plating layer having thickness of 2 μm formed as described above was coated with Ni—Au coat by electroless plating under the same conditions as those of Examples 19 to 21.

This resulted in the formation of satisfactory and continuous Ni—Au composite plating layer selectively on the surface of the connecting portion of the conductor wiring with good reproducibility.

A Cu foil was bonded via a commercially available anisotropically conductive film onto the Ni—Au composite plating layer on the connecting portion by thermal adhesion while heating to 200° C. and applying a pressure.

Resistance between two connectors that are connected via the anisotropically conductive film and the Cu foil was measured. The increase in the resistance over the resistance of the conductor was not larger than 5Ω, showing that good electrical connection was established.

A glass plate was bonded via a commercially available anisotropically conductive film onto the Ni—Au composite plating layer on the connecting portion by thermal adhesion while heating to 200° C. and applying a pressure.

Measurement of resistance between the two adjacent connectors showed a value far exceeding $10^8 \Omega$, showing that satisfactory insulation was established.

As Comparative Example 9, Cu foil was bonded via a commercially available anisotropically conductive film onto the conductor wiring that was formed by using the same electrically conductive paste as that used in Example 18 and was not subjected to the process subsequent to the etching, by thermal adhesion while heating to 200° C. and applying a pressure. Measurement of resistance between the two adjacent connectors showed that the increase in the resistance over the resistance of the conductor was far larger than 5Ω, showing that good electrical connection was not established.
<Examination of Resin of Board>

Example 23

A board for printed wiring was made by using polytetrafluoroethylene film as the board and applying surface roughening treatment to one side of the board under the same conditions as Example 1.

Measurement of the surface profile that was subjected to the surface roughening treatment similarly to Example 1 showed that center line average roughness Ra was 68 nm.

Then the same electrically conductive paste as used in Example 18 was used to print the conductor wiring having fine wiring portion of the following four different pitches on the surface of the board for printed wiring that was subjected to surface roughening treatment:

Line width 25 μm and space between lines 50 μm
Line width 30 μm and space between lines 60 μm
Line width 40 μm and space between lines 80 μm
Line width 50 μm and space between lines 100 μm The electrically conductive paste was then baked at 150° C. for 20 minutes thereby making the printed wiring board. Printing conditions were the same as those of Example 14.

Figure 8:
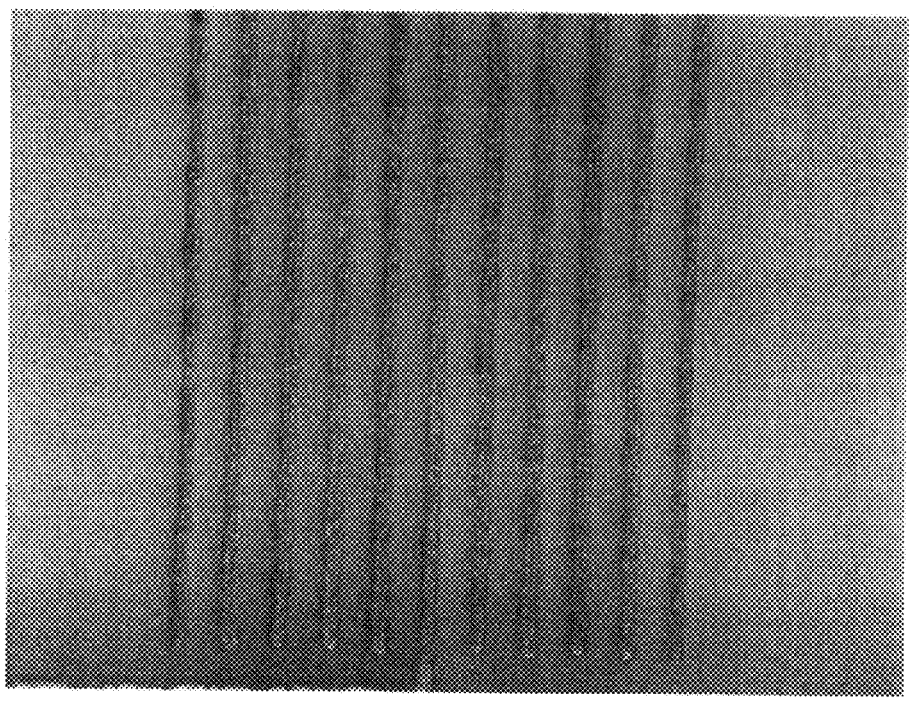
FIG. 8 is a photograph taken with a stereoscopic microscope of a fine wiring portion of a conductor wiring printed by using an electrically conductive paste on the treated surface of a board for printed wiring fabricated in Example 23.

The fine wiring portion of the conductor wiring that was formed was observed under a stereoscopic microscope. The result of printing was satisfactory with the electrically conductive paste bonded without being repelled on any of the fine wiring portion as shown in FIG. 8 that is a microscopic photograph of the fine wiring portion with line width of 25 μm and space between lines 50 μm.

The surface of the connecting portion of the conductor wiring described above was etched under the same conditions as Example 18 and was then coated with Cu by electroless Cu plating. This resulted in a satisfactory and continuous Cu plating layer formed selectively on the surface of the connecting portion with good reproducibility.

As Comparative Example 10, the electrically conductive paste was printed similarly as described above on the polytetrafluoroethylene film that was not subjected to the surface roughening treatment and was baked to form the conductor wiring. Observation with the stereoscopic microscope showed that the electrically conductive paste was repelled and the fine wiring portion was not formed.
<Evaluation of Mechanical Property>

Examples 24 to 26

The same electrically conductive paste as used in Example 18 was used to print the conductor wiring having fine wiring portion of the following two different pitches on the surface of the same board for printed wiring as made in Example 1 that was subjected to surface roughening treatment Line width 25 μm and space between lines 50 μm
Line width 50 μm and space between lines 100 μm After etching the entire surface of the conductor wiring, Cu coat was formed by electroless Cu plating. Thickness of the Cu coat was set to 1.8 μm (Example 24), 3.6 μm (Example 25) and 5.5 μm (Example 26).

Then an insulation ink (AR7100 manufactured by Ajinomoto Fine-Techno Co., Inc.) was printed to cover the conductor wiring of the board and was cured to form an insulation layer 15 μm in thickness.

Then the fine wiring portions of the two different pitches of the printed wiring boards of the Examples described above were attached to a fixture having diameter of bend 1.0 mm φ with the side of the conductor wiring facing the front, and were bent by 180°. Under this condition, heat cycle test was conducted by repeating a cycle of cooling at −40° C. for 30 minutes and heating at +80° C. for 30 minutes, and a change in resistance was measured.

Figure 9:
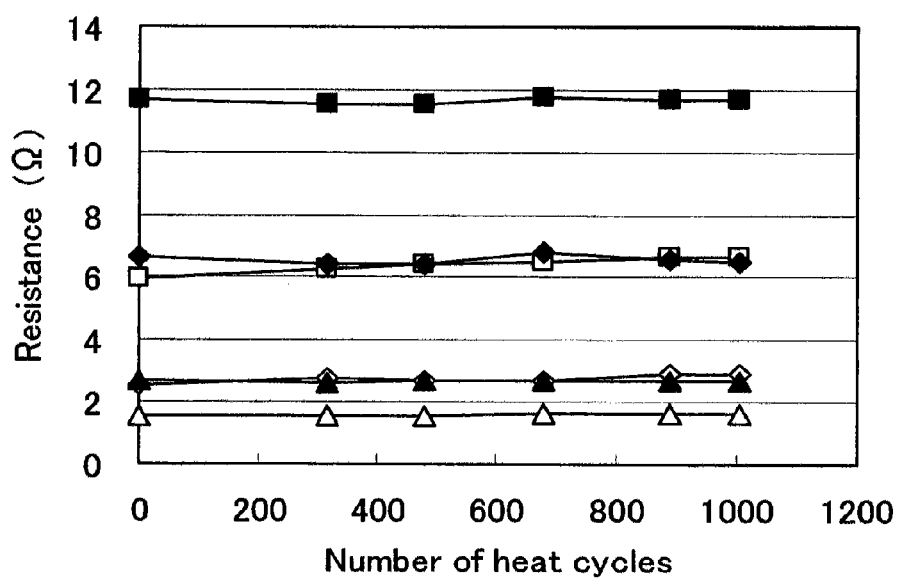
FIG. 9 is a graph showing the relationships of thickness and electrical resistance of the conductor wiring with the number of heat cycles in a printed wiring board fabricated in Example 24.

No significant change in resistance was found in any of the Examples and in any fine wiring portion, as shown in FIG. 9.

This result shows that the printed wiring boards of these Examples are capable of satisfactorily functioning as flexible printed wiring board. The strings of line segments in FIG. 9 represent the following.

-■-■-: The fine wiring portion with line width 25 μm of Example 24
-□-□-: The fine wiring portion with line width 50 μm of Example 24
-♦-♦-: The fine wiring portion with line width 25 μm of Example 25
-◇-◇-: The fine wiring portion with line width 50 μm of Example 25
-▲-▲-: The fine wiring portion with line width 25 μm of Example 26
-△-△-: The fine wiring portion with line width 50 μm of Example 26

The invention claimed is:

1. A method for producing a printed wiring board, the method comprising steps of:
   treating a surface of a board made of at least one resin selected from among the group consisting of polyimide, polyethylene naphthalate, polyamide-imide, polyethylene terephthalate, wholly aromatic polyamide, liquid crystalline polyester, and fluorine resin for forming a conductor wiring thereon by the following surface treatment method:
   surface roughening treatment for achieving center line average roughness Ra in a range from 40 to 200 nm followed by the step of forming a porous metal layer made of at least one kind of metal selected from among the group consisting of Al, Cr, Co, Ni, Cu and Ag, by sputtering;
   forming a conductor wiring by printing an electrically conductive paste containing metal particles M used as an electrically conductive filler made of at least one kind of metal selected from among the group consisting of Cu and Ag having an average particle diameter of 4 μm or smaller and maximum particle diameter of 15 μm or smaller and a binder B in volume ratio of M/B=1/1 to 1.9/1 on the surface of the board for the printed wiring; and
   forming a plating layer by plating on the surface of the conductor wiring where the metal particles have been exposed by etching the surface of the conductor wiring on at least a portion thereof used for connection with an external circuit so as to expose the metal particles on the surface.

* * * * *